(12) United States Patent
Johnson et al.

(10) Patent No.: US 9,997,652 B2
(45) Date of Patent: Jun. 12, 2018

(54) DEPOSITION APPROACHES FOR EMITTER LAYERS OF SOLAR CELLS

(71) Applicant: SUNPOWER CORPORATION, San Jose, CA (US)

(72) Inventors: Michael C. Johnson, Alameda, CA (US); Taiqing Qiu, Los Gatos, CA (US); David D. Smith, Campbell, CA (US); Peter John Cousins, Los Altos, CA (US); Staffan Westerberg, Sunnyvale, CA (US)

(73) Assignee: SunPower Corporation, San Jose, CA (US)

( * ) Notice: Subject to any disclaimer, the term of this patent is extended or adjusted under 35 U.S.C. 154(b) by 20 days.

(21) Appl. No.: 14/866,239

(22) Filed: Sep. 25, 2015

(65) Prior Publication Data

US 2016/0284923 A1    Sep. 29, 2016

Related U.S. Application Data

(60) Provisional application No. 62/137,196, filed on Mar. 23, 2015.

(51) Int. Cl.

| | |
|---|---|
| *H01L 31/18* | (2006.01) |
| *H01L 31/0224* | (2006.01) |
| *H01L 31/0216* | (2014.01) |
| *H01L 31/0236* | (2006.01) |
| *H01L 31/068* | (2012.01) |

(52) U.S. Cl.
CPC ........ *H01L 31/022441* (2013.01); *H01L 31/02167* (2013.01); *H01L 31/02363* (2013.01); *H01L 31/0682* (2013.01); *H01L 31/1804* (2013.01); *Y02E 10/547* (2013.01); *Y02P 70/521* (2015.11)

(58) Field of Classification Search
None
See application file for complete search history.

(56) References Cited

U.S. PATENT DOCUMENTS

| 9,570,638 B2 * | 2/2017 | Carlson .............. B23K 26/0876 |
| 2012/0266951 A1 | 10/2012 | Li et al. |
| 2012/0305063 A1 * | 12/2012 | Moslehi .......... H01L 31/035281 136/256 |
| 2013/0045562 A1 | 2/2013 | Liu et al. |
| 2013/0240029 A1 | 9/2013 | Smith |

FOREIGN PATENT DOCUMENTS

| WO | WO-2009079199 | 6/2009 |
| WO | WO-2013096500 | 6/2013 |

OTHER PUBLICATIONS

Search Report and Written Opinion for Application No. PCT/US2016/023316, dated Jun. 23, 2016, 14 pages.

* cited by examiner

*Primary Examiner* — Seahvosh Nikmanesh
(74) *Attorney, Agent, or Firm* — Schwabe, Williamson & Wyatt, P.C.

(57) ABSTRACT

Methods of fabricating solar cells, and the resulting solar cells, are described herein. In an example, a method of fabricating a solar cell includes forming a thin dielectric layer on a surface of a substrate by radical oxidation or plasma oxidation of the surface of the substrate. The method also involves forming a silicon layer over the thin dielectric layer. The method also involves forming a plurality of emitter regions from the silicon layer.

19 Claims, 11 Drawing Sheets

DEPOSITION APPROACHES FOR EMITTER LAYERS OF SOLAR CELLS

CROSS-REFERENCE TO RELATED APPLICATIONS

This application claims the benefit of U.S. Provisional Application No. 62/137,196, filed on Mar. 23, 2015, the entire contents of which are hereby incorporated by reference herein.

TECHNICAL FIELD

Embodiments of the present disclosure are in the field of renewable energy and, in particular, methods of fabricating solar cells, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1:
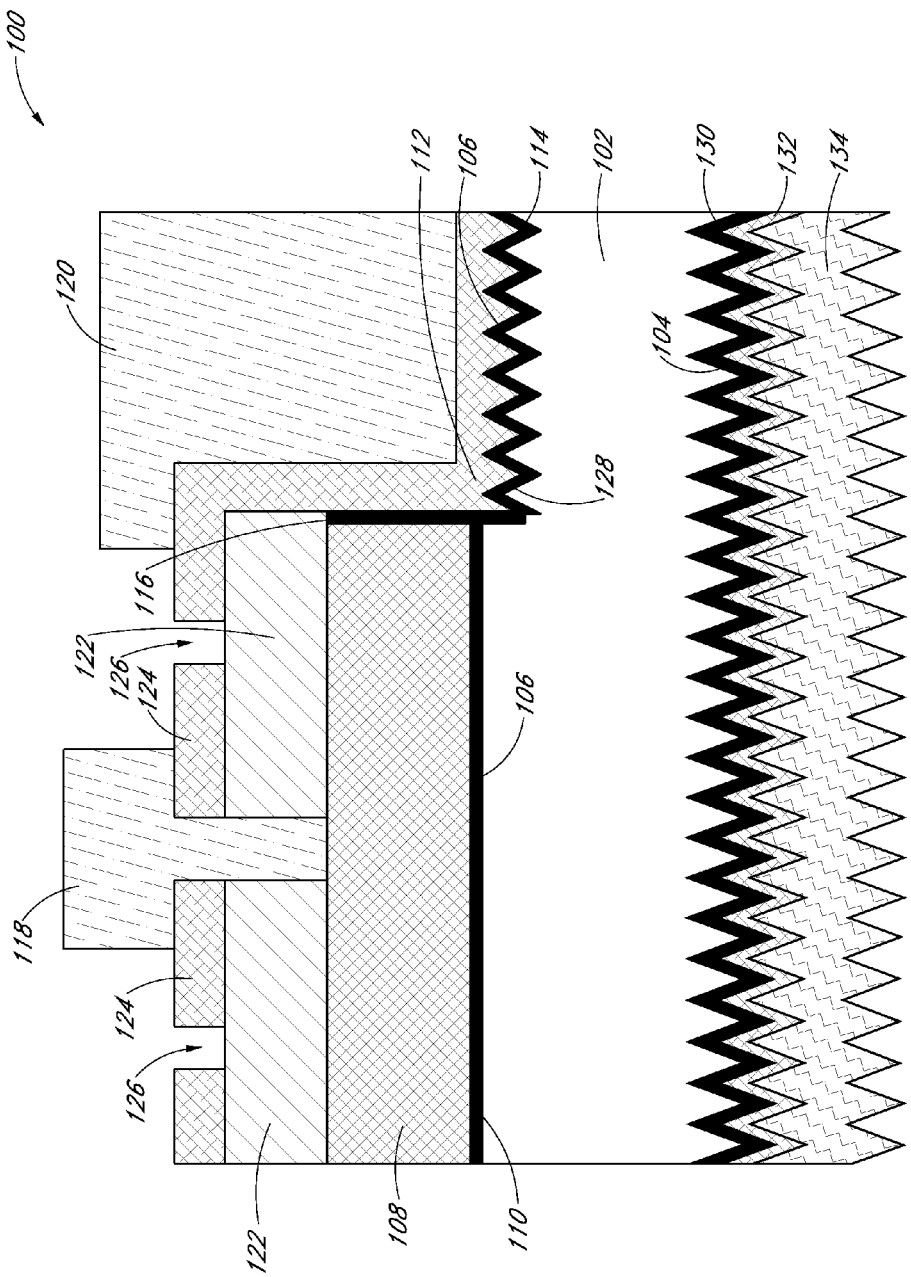
FIG. 1 illustrates a cross-sectional view of a portion of a back contact solar cell, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Methods of fabricating solar cells, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating a solar cell includes forming a thin dielectric layer on a surface of a substrate by radical oxidation or plasma oxidation of the surface of the substrate. The method also involves forming a silicon layer over the thin dielectric layer. The method also involves forming a plurality of emitter regions from the silicon layer.

In another embodiment, a method of fabricating a solar cell includes forming a thin dielectric layer on a surface of a substrate. The method also includes forming a patterned silicon layer over the thin dielectric layer using a shadow mask. The method also includes forming a plurality of emitter regions from the patterned silicon layer.

In another embodiment, a method of fabricating a solar cell includes forming a thin dielectric layer on a surface of a substrate. The method also includes forming a silicon layer over the thin dielectric layer. The method also includes forming a plurality of emitter regions from the silicon layer. The method also includes forming conductive contacts electrically connected to the plurality of emitter regions using a shadow mask.

In another embodiment, a method of fabricating a solar cell includes forming a thin dielectric layer on a surface of a substrate by wet chemical oxidation of the surface of the substrate. The method also includes forming a silicon layer over the thin dielectric layer by plasma enhanced chemical vapor deposition (PECVD). The method also includes forming a plurality of emitter regions from the silicon layer.

In a first example, FIG. 1 illustrates a cross-sectional view of a portion of a back contact solar cell 100, in accordance with an embodiment of the present disclosure. The solar cell 100 includes a substrate 102 having a light-receiving surface 104 and a back surface 106. A first polycrystalline silicon emitter region 108 of a first conductivity type is disposed on a first thin dielectric layer 110 disposed on the back surface 106 of the substrate 102. A second polycrystalline silicon emitter region 112 of a second, different, conductivity type is disposed on a second thin dielectric layer 114 disposed on the back surface 106 of the substrate 102. A third thin dielectric layer 116 is disposed laterally directly between the first 108 and second 112 polycrystalline silicon emitter regions. A first conductive contact structure 118 is disposed on the first polycrystalline silicon emitter region 108. A second conductive contact structure 120 is disposed on the second polycrystalline silicon emitter region 112.

Referring again to FIG. 1, in an embodiment, the solar cell 100 further includes an insulator layer 122 disposed on the first polycrystalline silicon emitter region 108. The first conductive contact structure 118 is disposed through the insulator layer 122. Additionally, a portion of the second polycrystalline silicon emitter region 112 overlaps the insulator layer 122 but is separate from the first conductive contact structure 118. In an embodiment, an additional polycrystalline silicon layer 124 of the second conductivity type is disposed on the insulator layer 122, and the first conductive contact structure 118 is disposed through the polycrystalline silicon layer 124 of the second conductivity type and through the insulator layer 122, as is depicted in FIG. 1. As described in greater detail below, in one such embodiment, the additional polycrystalline silicon layer 124 and the second polycrystalline silicon emitter region 112 are formed from a same layer that is blanket deposited and then scribed to provide scribe lines 126 therein.

Referring again to FIG. 1, in an embodiment, the solar cell 100 further includes a recess 128 disposed in the back surface 106 of the substrate 102. The second polycrystalline silicon emitter region 112 and the second thin dielectric layer 114 are disposed in the recess 128. In one such embodiment, the recess 128 has a texturized surface, and the second polycrystalline silicon emitter region 112 and the second thin dielectric layer 114 are conformal with the texturized surface, as is depicted in FIG. 1. In an embodiment, then, the first polycrystalline silicon emitter region 108 and the first thin dielectric layer 110 are disposed on a flat portion of the back surface 106 of the substrate 102, and the second polycrystalline silicon emitter region 112 and the second thin dielectric layer 114 are disposed on a texturized portion of the back surface 106 of the substrate, as is depicted in FIG. 1. It is to be appreciated, however, that other embodiments may not include a texturized surface, or may not include a recess altogether.

Referring again to FIG. 1, in an embodiment, the solar cell 100 further includes a fourth thin dielectric layer 130 disposed on the light-receiving surface 104 of the substrate 102. A polycrystalline silicon layer 132 of the second conductivity type is disposed on the fourth thin dielectric layer 132. An anti-reflective coating (ARC) layer 134, such as a layer of silicon nitride, is disposed on the polycrystalline silicon layer 132. In one such embodiment, as described in greater detail below, the fourth thin dielectric layer 132 is formed by essentially the same process used to form the second thin dielectric layer 114, and the polycrystalline silicon layer 132 is formed by essentially the same process used to form the second polycrystalline silicon emitter region 112.

In an embodiment, the first polycrystalline silicon emitter region 108 is a P-type polycrystalline silicon emitter region. The second polycrystalline silicon emitter region 112 is an N-type polycrystalline silicon emitter region. The substrate is an N-type monocrystalline silicon substrate. In an embodiment, the first thin dielectric layer 110, the second thin dielectric layer 114 and the third thin dielectric layer 116 include silicon dioxide. However, in another embodiment, the first thin dielectric layer 110 and the second thin dielectric layer 114 include silicon dioxide, while the third thin dielectric layer 116 includes silicon nitride. In an embodiment, insulator layer 122 includes silicon dioxide.

In an embodiment, the first conductive contact structure 118 and the second conductive contact structure 120 each include an aluminum-based metal seed layer disposed on the first 108 and second 112 polycrystalline silicon emitter regions, respectively. In one embodiment, each of the first conductive contact structure 118 and the second conductive contact structure 120 further includes a metal layer, such as a copper layer, disposed on the aluminum-based metal seed layer.

Figure 2:
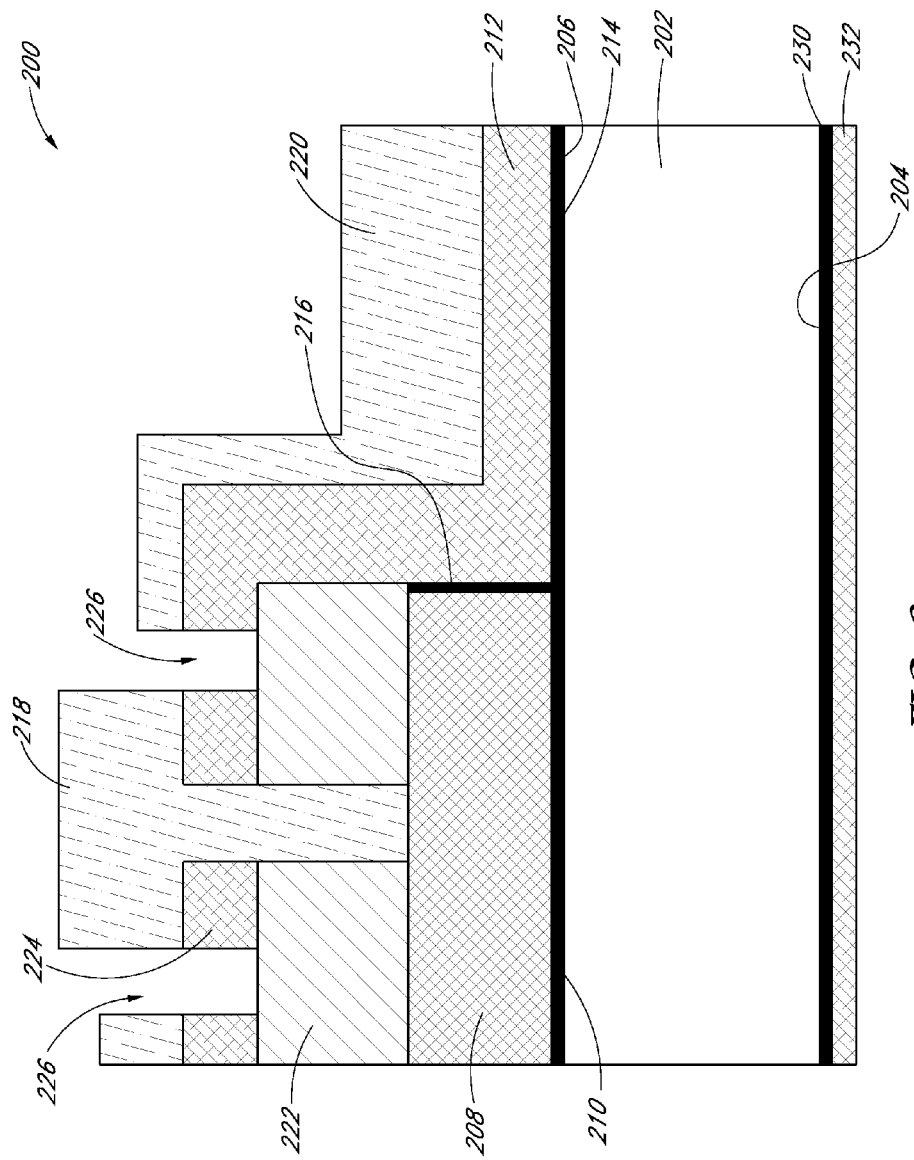
FIG. 2 illustrates a cross-sectional view of a portion of a back contact solar cell, in accordance with another embodiment of the present disclosure.

In a second example, FIG. 2 illustrates a cross-sectional view of a portion of a back contact solar cell 200, in accordance with another embodiment of the present disclosure. The solar cell 200 includes a substrate 202 having a light-receiving surface 204 and a back surface 206. A first polycrystalline silicon emitter region 208 of a first conductivity type is disposed on a first thin dielectric layer 210 disposed on the back surface 206 of the substrate 202. A second polycrystalline silicon emitter region 212 of a second, different, conductivity type is disposed on a second thin dielectric layer 214 disposed on the back surface 206 of the substrate 202. A third thin dielectric layer 216 is disposed laterally directly between the first 208 and second 212 polycrystalline silicon emitter regions. A first conductive contact structure 218 is disposed on the first polycrystalline silicon emitter region 208. A second conductive contact structure 220 is disposed on the second polycrystalline silicon emitter region 212.

In accordance with an embodiment of the present disclosure, the first 218 and second 220 conductive contact structures each include a metal silicide layer disposed on the first 208 and second 212 polycrystalline silicon emitter regions, respectively. In one such embodiment, the metal silicide layer is formed by consuming exposed regions of the first 208 and second 212 polycrystalline silicon emitter regions in a silicidation process. As such, all exposed top surfaces of the first 208 and second 212 polycrystalline silicon emitter regions, and any other exposed silicon surfaces, are metalized, as is depicted in FIG. 2. In an embodiment, the first 218 and second 220 conductive contact structures each further includes a metal layer (such as copper) disposed on the metal silicide layer. In a particular embodiment, the metal silicide layer includes a material such as, but not limited to, titanium silicide ($TiSi_2$), cobalt silicide ($CoSi_2$), tungsten silicide ($WSi_2$), or nickel silicide ($NiSi$ or $NiSi_2$).

Referring again to FIG. 2, in an embodiment, the solar cell 200 further includes an insulator layer 222 disposed on the first polycrystalline silicon emitter region 208. The first conductive contact structure 218 is disposed through the insulator layer 222. Additionally, a portion of the second polycrystalline silicon emitter region 212 overlaps the insulator layer 222 but is separate from the first conductive contact structure 218. In an embodiment, an additional polycrystalline silicon layer 224 of the second conductivity type is disposed on the insulator layer 222, and the first conductive contact structure 218 is disposed through the polycrystalline silicon layer 224 of the second conductivity type and through the insulator layer 222, as is depicted in FIG. 2. However, in contrast to FIG. 1, the entire top surface of the polycrystalline silicon layer 224 is metalized. As described in greater detail below, in one such embodiment, the additional polycrystalline silicon layer 224 and the second polycrystalline silicon emitter region 212 are formed from a same layer that is blanket deposited and then scribed to provide scribe lines 226 therein.

Referring again to FIG. 2, in an embodiment, the back surface 206 of the substrate 202 is essentially entirely flat. However, in another embodiment, the second polycrystalline silicon emitter region 212 and the second thin dielectric layer 214 are disposed in a recess, as was described in association with FIG. 1. In one such embodiment, the recess has a texturized surface, and the second polycrystalline silicon emitter region 212 and the second thin dielectric layer 214 are conformal with the texturized surface.

Referring again to FIG. 2, in an embodiment, the solar cell 200 further includes a fourth thin dielectric layer 230 disposed on the light-receiving surface 204 of the substrate 202. A polycrystalline silicon layer 232 of the second conductivity type is disposed on the fourth thin dielectric layer 232. Although not depicted, in an embodiment, an anti-reflective coating (ARC) layer, such as a layer of silicon nitride, is disposed on the polycrystalline silicon layer 232. In one such embodiment, as described in greater detail below, the fourth thin dielectric layer 232 is formed by essentially the same process used to form the second thin dielectric layer 214, and the polycrystalline silicon layer 232 is formed by essentially the same process used to form the second polycrystalline silicon emitter region 212.

In an embodiment, the substrate 202, the first polycrystalline silicon emitter region 208, the second polycrystalline silicon emitter region 212 and the various dielectric layers are as described above for the substrate 102, the first polycrystalline silicon emitter region 108, the second polycrystalline silicon emitter region 112 and the various dielectric layers in association with FIG. 1.

Figure 3:
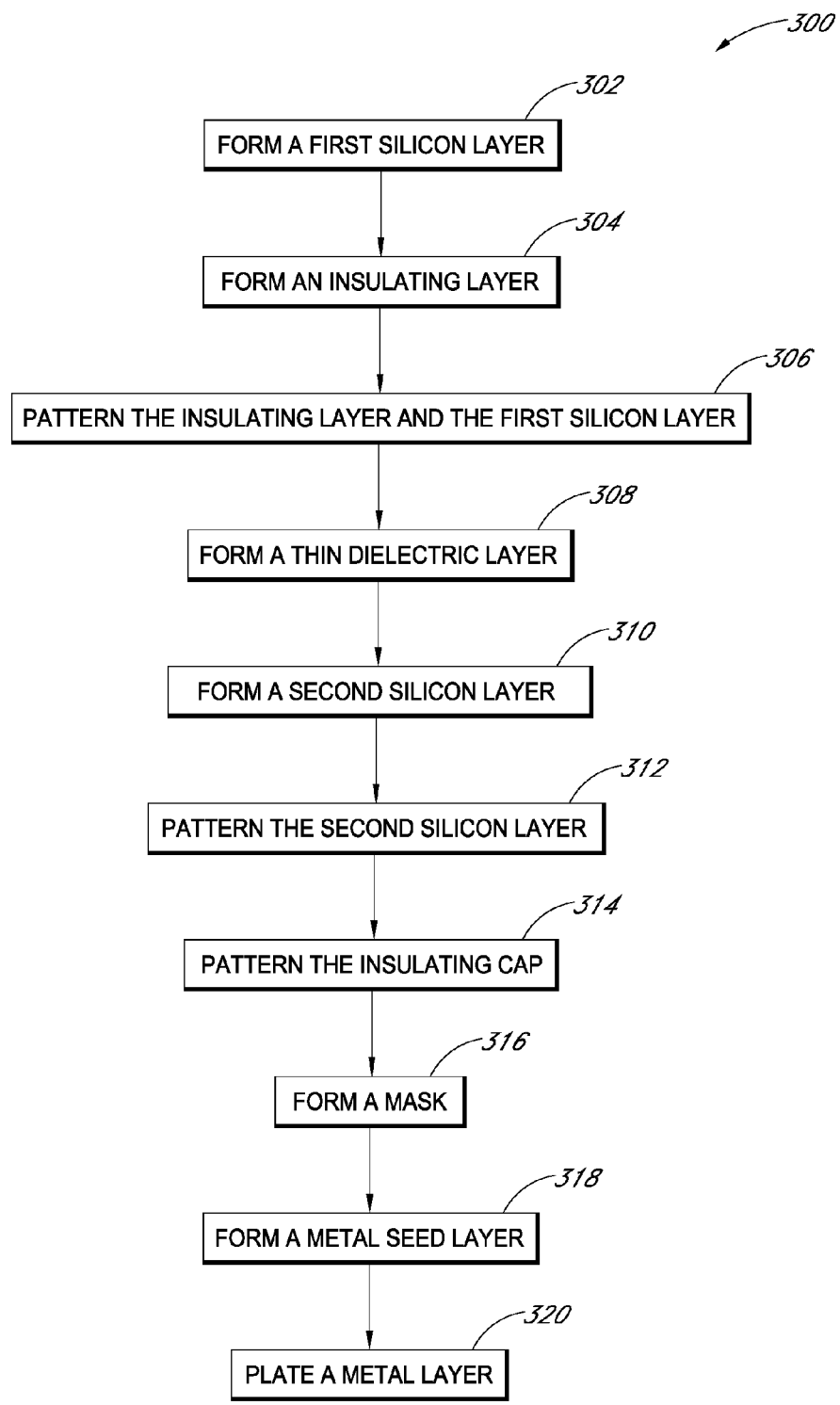
FIG. 3 is a flowchart listing operations in a method of fabricating a solar cell as corresponding to FIGS. 5A-5F, in accordance with an embodiment of the present disclosure.
Figure 4:
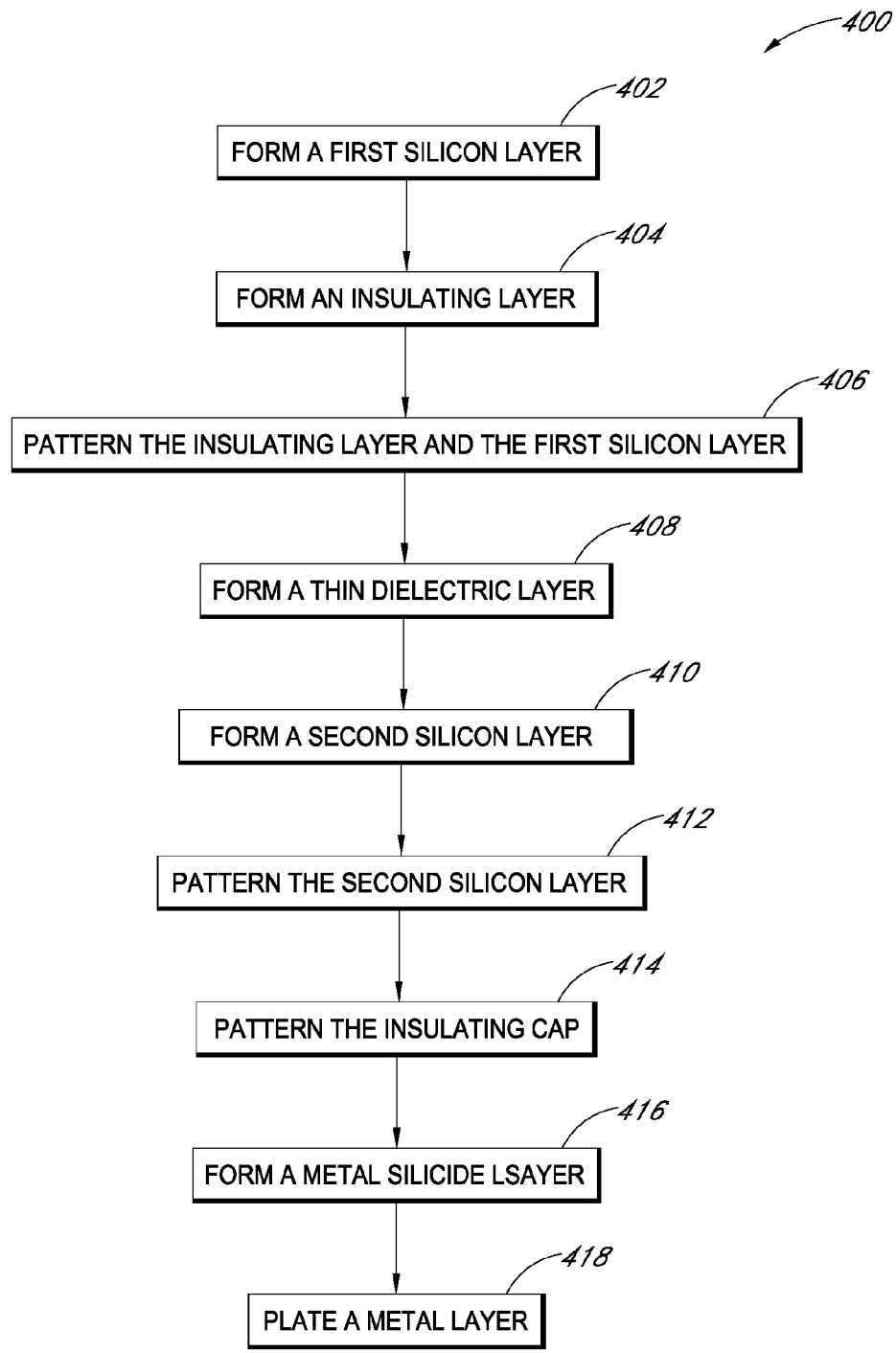
FIG. 4 is a flowchart listing operations in a method of fabricating a solar cell as corresponding to FIGS. 5A-5F, in accordance with an embodiment of the present disclosure.

Also disclosed herein are methods of fabricating solar cells. In a first exemplary process flow, FIGS. 5A-5F illustrate cross-sectional views of various stages in the fabrication of a solar cell, in accordance with an embodiment of the present disclosure. FIG. 3 is a flowchart 300 listing operations in a method of fabricating a solar cell as corresponding to FIGS. 5A-5F, in accordance with an embodiment of the present disclosure.

Figure 5A:
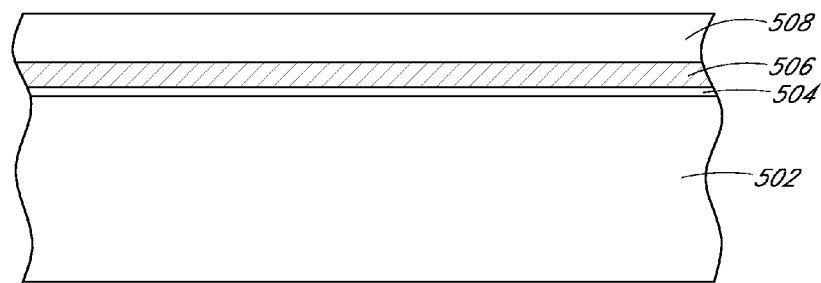
FIGS. 5A-5F illustrate cross-sectional views of various stages in the fabrication of a solar cell, in accordance with an embodiment of the present disclosure.

Referring to FIG. 5A and corresponding operation 302 of flowchart 300, a method of fabricating alternating N-type and P-type emitter regions of a solar cell involves forming a first silicon layer 506 of a first conductivity type on a first thin dielectric layer 504 formed on a back surface of a substrate 502.

In an embodiment, the substrate 502 is a monocrystalline silicon substrate, such as a bulk single crystalline N-type doped silicon substrate. It is to be understood, however, that substrate 502 may be a layer, such as a multi-crystalline silicon layer, disposed on a global solar cell substrate. In an embodiment, the first thin dielectric layer 504 is a thin oxide layer such as a tunnel dielectric silicon oxide layer having a thickness of approximately 2 nanometers or less.

In an embodiment, the first silicon layer 506 is a polycrystalline silicon layer that is doped to have the first conductivity type either through in situ doping, post deposition implanting, or a combination thereof. In another embodiment the first silicon layer 506 is an amorphous silicon layer such as a hydrogenated silicon layer represented by a-Si:H which is implanted with dopants of the first conductivity type subsequent to deposition of the amorphous silicon layer. In one such embodiment, the first silicon layer 506 is subsequently annealed (at least at some subsequent stage of the process flow) to ultimately form a polycrystalline silicon layer. In an embodiment, for either a polycrystalline silicon layer or an amorphous silicon layer, if post deposition implantation is performed, the implanting is performed by using ion beam implantation or plasma immersion implantation. In one such embodiment, a shadow mask is used for the implanting. In a specific embodiment, the first conductivity type is P-type (e.g., formed using boron impurity atoms).

Referring again to FIG. 5A and now to corresponding operation 304 of flowchart 300, an insulating layer 508 is formed on the first silicon layer 506. In an embodiment the insulating layer 508 includes silicon dioxide.

Figure 5B:
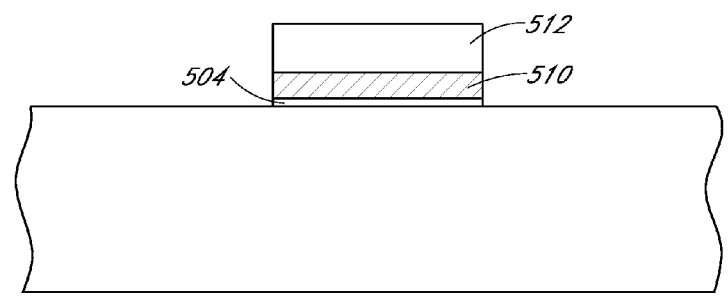

Referring to FIG. 5B and corresponding operation 306 of flowchart 300, the insulating layer 508 and the first silicon layer 506 are patterned to form a first silicon region 510 of the first conductivity type having an insulating cap 512 thereon. In an embodiment, a lithographic or screen print masking and subsequent etch process is used to pattern the insulating layer 508 and the first silicon layer 506. In another embodiment, a laser ablation process (e.g., direct write) is used to pattern the insulating layer 508 and the first silicon layer 506. In either case, in one embodiment, the first thin dielectric layer 504 is also patterned in the process, as is depicted in FIG. 5B.

Figure 5C:
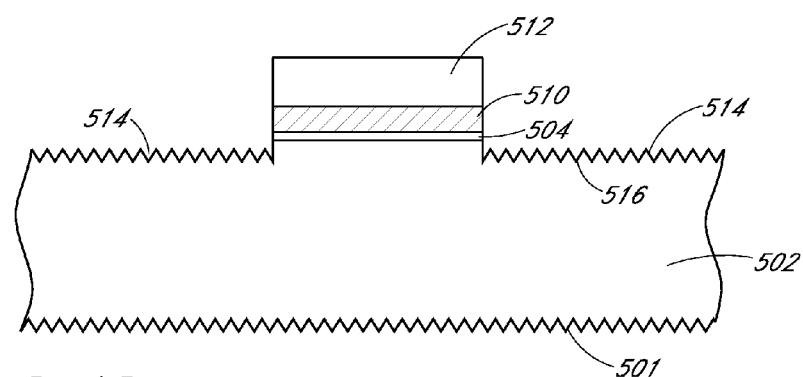

Referring to FIG. 5C, optionally, recesses 514 may be formed in the substrate 502 during (or subsequent to) the patterning of the insulating layer 508 and the first silicon layer 506. Furthermore, in one embodiment, the surfaces 516 of the recesses 514 are texturized. In a same or similar process, a light receiving surface 501 of the substrate 502 may also be texturized, as is depicted in FIG. 5C. In an embodiment, a hydroxide-based wet etchant is used to form at least a portion of the recesses 514 and/or to texturize exposed portions of the substrate 502. A texturized surface may be one which has a regular or an irregular shaped surface for scattering incoming light, decreasing the amount of light reflected off of the light-receiving and/or exposed surfaces of the solar cell. It is to be appreciated, however, that the texturizing of the back surface and even the recess formation may be omitted from the process flow.

Figure 5D:
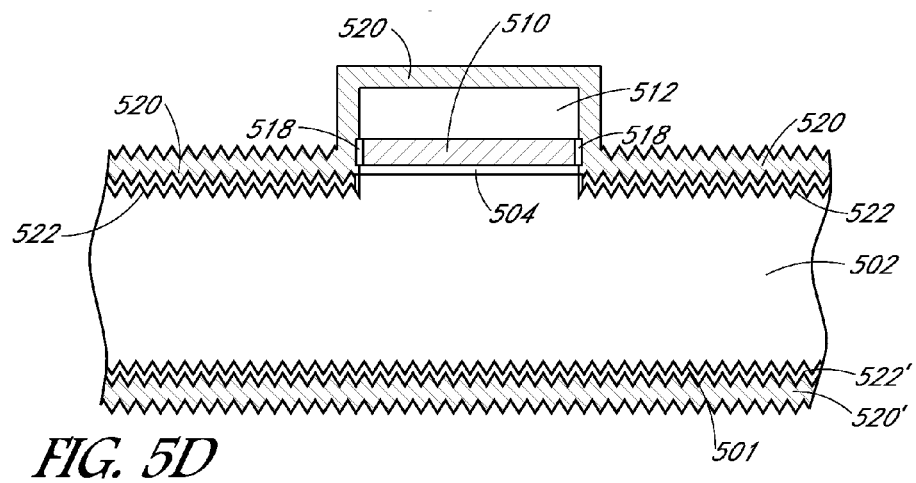

Referring to FIG. 5D and corresponding operation 308 of flowchart 300, a second thin dielectric layer 518 is formed on exposed sides of the first silicon regions 518. In an embodiment, the second thin dielectric layer 518 is formed in an oxidation process and is a thin oxide layer such as a tunnel dielectric silicon oxide layer having a thickness of approximately 2 nanometers or less. In another embodiment, the second thin dielectric layer 518 is formed in a deposition process and is a thin silicon nitride layer or silicon oxynitride layer. As is explained below in more detail, in one embodiment, the dielectric layers (e.g., the first thin dielectric layer 504, the second thin dielectric layer 518) are amorphous dielectric layers formed by oxidation of a silicon substrate (e.g., via plasma enhanced chemical vapor deposition (PECVD). The oxidation of silicon may involve, for example, plasma oxidation and/or radical oxidation.

Referring again to FIG. 5D and now to corresponding operation 310 of flowchart 300, a second silicon layer 520 of a second, different, conductivity type is formed on a third thin dielectric layer 522 formed on the back surface of the substrate 502, and on the second thin dielectric layer 518 and the insulating cap 512 of the first silicon regions 510. Corresponding thin dielectric layer 522' and second silicon layer 520' of the second conductivity type may also be formed on the light-receiving surface 501 of the substrate 502, is same or similar process operations, as is depicted in FIG. 5D. Additionally, although not depicted, an ARC layer may be formed on the corresponding second silicon layer 520', as was described in association with FIG. 1.

In an embodiment, the third thin dielectric layer 518 is formed in an oxidation process and is a thin oxide layer such as a tunnel dielectric silicon oxide layer having a thickness of approximately 2 nanometers or less. In an embodiment, the second silicon layer 520 is a polycrystalline silicon layer that is doped to have the second conductivity type either through in situ doping, post deposition implanting, or a combination thereof. In another embodiment the second silicon layer 520 is an amorphous silicon layer such as a hydrogenated silicon layer represented by a-Si:H which is implanted with dopants of the second conductivity type subsequent to deposition of the amorphous silicon layer. In one such embodiment, the second silicon layer 520 is subsequently annealed (at least at some subsequent stage of the process flow) to ultimately form a polycrystalline silicon layer. In an embodiment, for either a polycrystalline silicon layer or an amorphous silicon layer, if post deposition implantation is performed, the implanting is performed by using ion beam implantation or plasma immersion implantation. In one such embodiment, a shadow mask is used for the implanting. In a specific embodiment, the second conductivity type is N-type (e.g., formed using phosphorus atoms or arsenic impurity atoms).

Figure 5E:
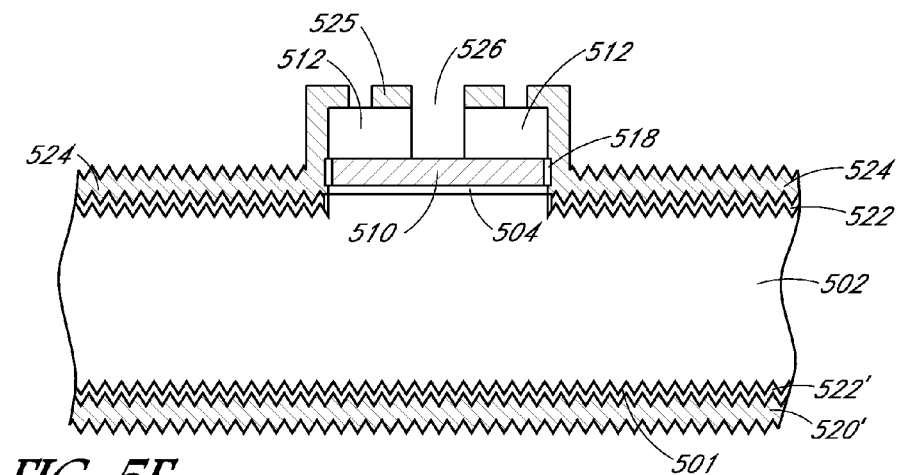

Referring to FIG. 5E and corresponding operation 312 of flowchart 300, the second silicon layer 520 is patterned to form isolated second silicon regions 524 of the second conductivity type and to form a contact opening 526 in regions of the second silicon layer 520 above the insulating cap 512 of the first silicon regions 510. In an embodiment, discrete regions of silicon 525 may remain as an artifact of the patterning process. In an embodiment, a laser ablation process is used to pattern the second silicon layer 520.

Referring again to FIG. 5E and now to corresponding operation 314 of flowchart 300, the insulating cap 512 is patterned through the contact openings 526 to expose portions of the first silicon regions 510. In an embodiment, the insulating cap 512 is patterned using a laser ablation process. For example, in one embodiment, a first laser pass is used to used to pattern the second silicon layer 520, including forming contact opening 526. A second laser pass in the same location as contact opening 526 is the used to pattern the insulating cap 512.

Figure 5F:
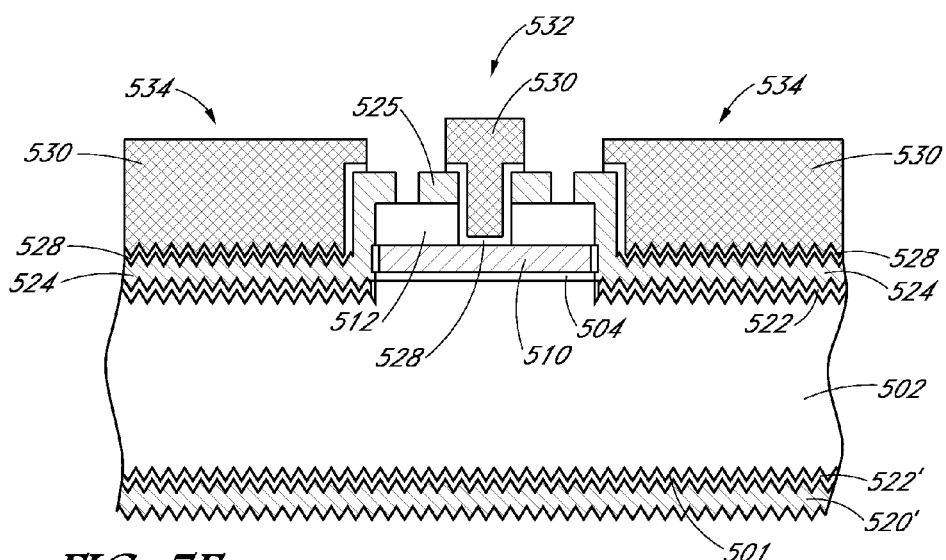

Referring to FIG. 5F, a metal seed layer 528 is formed on the exposed portions of the first silicon regions 510 and on the isolated second silicon regions 524. A metal layer 530 is plated on the metal seed layer to form conductive contacts 532 and 534, respectively, for the first silicon regions 510 and the isolated second silicon regions 524. In an embodiment, the metal seed layer 528 is an aluminum-based metal seed layer, and the metal layer 530 is a copper layer. In an embodiment, a mask is first formed to expose only the exposed portions of the first silicon regions 510 and the isolated second silicon regions 524 in order to direct the metal seed layer 528 formation to restricted locations.

Figure 6A:
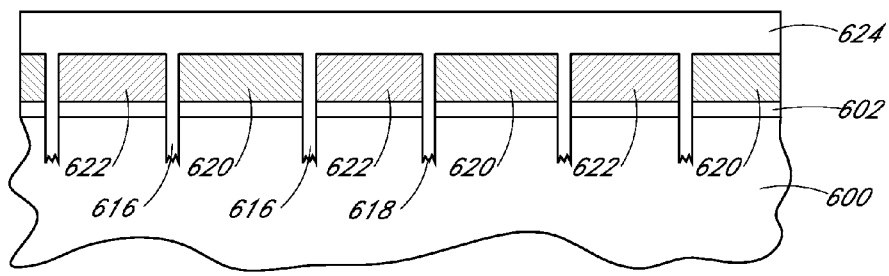
FIGS. 6A-6C illustrate cross-sectional views of various processing operations in a method of fabricating solar cells having conductive contacts, in accordance with an embodiment of the present disclosure.
Figure 6B:
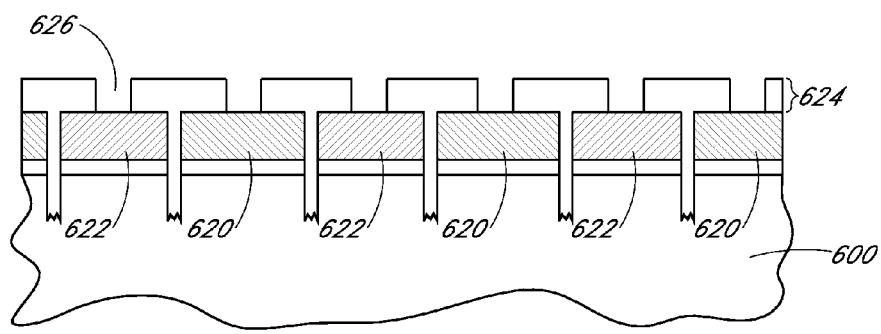
Figure 6C:
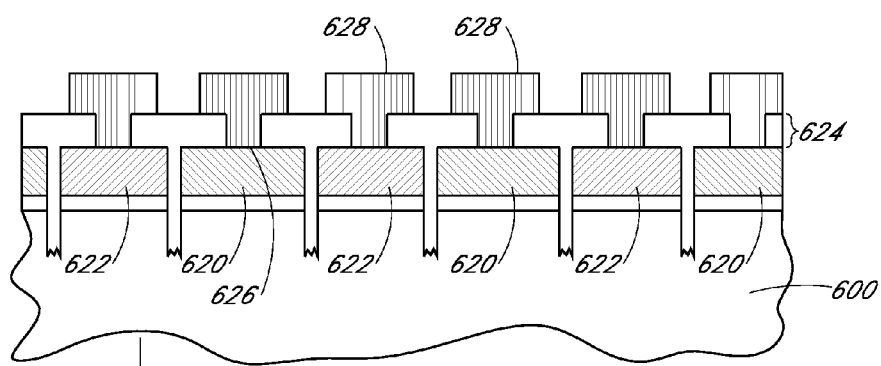

FIGS. 6A-6C illustrate cross-sectional views of various processing operations in a method of fabricating solar cells having conductive contacts, in accordance with an embodiment of the present disclosure. Referring to FIG. 6A, a method of forming contacts for a back-contact solar cell includes forming a thin dielectric layer 602 on a substrate 600.

In an embodiment, the thin dielectric layer 602 is composed of silicon dioxide and has a thickness approximately in the range of 5-50 Angstroms. In one embodiment, the thin dielectric layer 602 ultimately performs as a tunneling oxide layer in a functioning solar cell. The dielectric layer 602 may be formed via a similar, or the same, process as the dielectric layers described above with respect to FIGS. 5D and 5E. For example, the dielectric layer 602 may be an amorphous dielectric layer. An amorphous dielectric layer may be formed by oxidation of a silicon substrate (e.g., via PECVD). Oxidation of the silicon layer may involve, for example, plasma oxidation and/or radical oxidation. Additional details regarding formation of an amorphous dielectric layer formed by oxidation are explained below. In an embodiment, substrate 600 is a bulk single-crystal substrate, such as an n-type doped single crystalline silicon substrate. However, in an alternative embodiment, substrate 600 includes a polycrystalline silicon layer disposed on a global solar cell substrate.

Referring again to FIG. 6A, trenches 616 are formed between n-type doped polysilicon regions 620 and p-type doped polysilicon regions 622. Portions of the trenches 616 can be texturized to have textured features 618, as is also depicted in FIG. 6A.

Referring again to FIG. 6A, an insulating layer 624 is formed above the plurality of n-type doped polysilicon regions 620, the plurality of p-type doped polysilicon regions 622, and the portions of substrate 600 exposed by trenches 616. In one embodiment, a lower surface of the insulating layer 624 is formed conformal with the plurality of n-type doped polysilicon regions 620, the plurality of p-type doped polysilicon regions 622, and the exposed portions of substrate 600, while an upper surface of insulating layer 624 is substantially flat, as depicted in FIG. 6A.

Referring to FIG. 6B, a plurality of contact openings 626 are formed in the insulating layer 624. The plurality of contact openings 626 provide exposure to the plurality of n-type doped polysilicon regions 620 and to the plurality of p-type doped polysilicon regions 622. In one embodiment, the plurality of contact openings 626 is formed by laser ablation. In one embodiment, the contact openings 626 to the n-type doped polysilicon regions 620 have substantially the same height as the contact openings to the p-type doped polysilicon regions 622, as depicted in FIG. 6B.

Referring to FIG. 6C, the method of forming contacts for the back-contact solar cell further includes forming conductive contacts 628 in the plurality of contact openings 626 and coupled to the plurality of n-type doped polysilicon regions 620 and to the plurality of p-type doped polysilicon regions 622. In an embodiment, conductive contacts 628 are formed on or above a surface of a bulk N-type silicon substrate 600 opposing a light receiving surface 601 of the bulk N-type silicon substrate 600. In a specific embodiment, the conductive contacts are formed on regions (622/620) above the surface of the substrate 600, as depicted in FIG. 6C. The fabrication of the conductive contacts can involve use of one or more sputtered conductive layers, as described above.

In one embodiment, a method of fabricating a solar cell involves forming an amorphous dielectric layer on the back surface of a substrate opposite a light-receiving surface of the substrate. In one embodiment, the substrate is a monocrystalline substrate, and forming the amorphous dielectric layer may involve oxidizing the back surface of the substrate. According to one embodiment, the amorphous dielectric layer is formed by oxidation of silicon using plasma oxidation and/or radical oxidation. In another embodiment, a thin dielectric layer is formed on a surface of a substrate by wet chemical oxidation of the surface of the substrate. In a particular such embodiment, wet chemical oxidation of the surface of the substrate involves using an aqueous ozone process.

The method further involves forming a microcrystalline silicon layer on the amorphous dielectric layer by plasma enhanced chemical vapor deposition (PECVD). The method further involves forming an amorphous silicon layer on the microcrystalline silicon layer by PECVD and annealing the microcrystalline silicon layer and the amorphous silicon layer to form a homogeneous polycrystalline silicon layer from the microcrystalline silicon layer and the amorphous silicon layer. The method also involves forming an emitter region from the homogeneous polycrystalline silicon layer.

Thus, formation of the dielectric layer may involve oxidation of a silicon layer (e.g., PECVD). Oxidation of the silicon layer may involve, for example, plasma oxidation and/or radical oxidation. Formation of the dielectric layer may then be followed by polycrystalline or amorphous silicon deposition (e.g., via PECVD blister-free deposition). For example, referring to FIG. 5D, following formation of the dielectric layers 522, 504, and 518, the second silicon layer 520 may be deposited by PECVD (e.g., blister-free PECVD). Thus, the process flow may involve growing $SiO_2$ on a silicon substrate in a vacuum chamber, e.g., a PECVD, chamber, followed by PECVD blister-free amorphous silicon (a-Si) deposition.

The oxidation operation can be performed in a separate chamber followed by wafer transfer to and a-Si deposition in PECVD chamber without vacuum break. The oxidation operation can also be performed in the same PECVD chamber sequentially with sufficient pump-and-purge between oxidation and deposition operations.

Oxidation to grow tunnel oxides may be performed by plasma oxidation or radical oxidation, for example. In one embodiment, plasma oxidation involves using oxidants including $N_2O$, $O_2$, CO, $CO_2$, etc., at pressures ranging from 50 mTorr to 10 Torr.

In another embodiment, radical oxidation involves using $O_3$ or a remote-plasma oxygen radical source. Radical oxidation may eliminate ion bombardments and plasma charge damage during plasma oxidation. According to one embodiment, radical oxidation involves utilizing extremely reactive oxygen radicals, O, to oxidize silicon at low temperatures and form high-qualify, thermal-oxide such as $SiO_2$. In one embodiment, $O_3$-based radical oxidation is performed at 200-400° C. and 0.5 to 10 Torr. However, radical oxidation also works above 10 Torr as well, with the drawback of higher running cost at higher pressures. In one embodiment, a remote O source is used. Oxygen radicals are created in a remote plasma source by cracking oxidants, such as $O_2$, $N_2O$, CO or $CO_2$, etc. Radicals are then delivered into chamber over wafers to grow a thin layer of high-quality oxides.

According to one embodiment, a single chamber tool may be used to run sequential oxidation and deposition processes. In another embodiment, a cluster tool can run oxidation and deposition at separate chambers with no vacuum break in between.

A double-layer showerhead may be used for radical oxidation. A shallow plasma chamber above the main showerhead allows O generation without exposing wafers to direct plasma and ion bombardment. It is turned on only during radical oxidation, according to an embodiment. During a-Si deposition, the main showerhead drives a plasma beneath it and directly above wafers.

Regarding the microcrystalline silicon layer and the amorphous silicon layer, formation of the microcrystalline silicon layer by PECVD and the amorphous silicon layer by PECVD may involve forming the microcrystalline silicon layer and the amorphous silicon layer in a single pass of a PECVD chamber. In one embodiment, forming the microcrystalline silicon layer involves depositing microcrystalline silicon by PECVD at a deposition rate approximately in the range of 15-20 nanometers per minute. Forming the amorphous silicon layer may involve depositing amorphous silicon by PECVD at a deposition rate approximately in the range of 200-400 nanometers per minute.

Forming the amorphous silicon layer may involve forming an N-type or P-type amorphous silicon layer by flowing phosphine or diborane, respectively, during the forming the amorphous silicon layer by PECVD. Annealing the microcrystalline silicon layer and the amorphous silicon layer may involve heating at a temperature of approximately 700 degrees Celsius for a duration of approximately 10 minutes. According to one embodiment, forming the microcrystalline silicon layer involves forming the microcrystalline silicon layer to a thickness approximately in the range of 2-50 nanometers, and forming the amorphous silicon layer involves forming the amorphous silicon layer to a thickness approximately in the range of 10-30 nanometers. Annealing the microcrystalline silicon layer and the amorphous silicon layer to form the homogeneous polycrystalline silicon layer may include forming a blister-free homogeneous polycrystalline silicon layer.

In another embodiment, a method of fabricating a solar cell with differentiated P-type and N-type architectures involves forming a first microcrystalline silicon layer on a first thin dielectric layer formed on a back surface of a substrate, the first microcrystalline silicon layer formed by plasma enhanced chemical vapor deposition (PECVD). The method further involves forming a P-type amorphous silicon layer on the first microcrystalline silicon layer by PECVD, and forming an insulating layer on the P-type amorphous silicon layer.

The method further involves patterning the insulating layer and the P-type amorphous silicon layer to form P-type amorphous silicon regions having an insulating cap thereon with trenches in the substrate separating the P-type amorphous silicon regions. A second thin dielectric layer is formed on exposed sides of the P-type amorphous silicon regions and in the trenches. The second thin dielectric layer may be formed using the same, or similar processes described above. A second microcrystalline silicon layer is formed on the second thin dielectric layer by PECVD. The method further involves forming an N-type amorphous silicon layer on the second microcrystalline silicon layer by PECVD. The method also involves annealing the first microcrystalline silicon layer and the P-type amorphous silicon regions to form P-type homogeneous polycrystalline silicon regions and annealing the second microcrystalline silicon layer and the N-type amorphous silicon layer to form an N-type homogeneous polycrystalline silicon layer. Conductive contacts are formed to the P-type homogeneous polycrystalline silicon regions and to the N-type homogeneous polycrystalline silicon layer.

According to one such embodiment, forming an amorphous dielectric layer on the back surface of a substrate opposite a light-receiving surface of the substrate. An amorphous dielectric layer may be formed by the same or similar processes as explained above. For example, in one embodiment, the substrate is a monocrystalline substrate, and forming the amorphous dielectric layer comprises oxidizing the back surface of the substrate. In one embodiment, an amorphous dielectric layer may be formed by oxidizing the silicon substrate via plasma oxidation and/or radical oxidation.

Forming the first microcrystalline silicon layer by PECVD and the P-type amorphous silicon layer by PECVD may involve forming the first microcrystalline silicon layer and the P-type amorphous silicon layer in a first single pass of a PECVD chamber, and wherein forming the second microcrystalline silicon layer by PECVD and the N-type amorphous silicon layer by PECVD comprises forming the second microcrystalline silicon layer and the N-type amorphous silicon layer in a second single pass of a PECVD chamber.

Formation of the first and second microcrystalline silicon layers may involve depositing microcrystalline silicon by PECVD at a deposition rate approximately in the range of 5-50 nanometers per minute. Formation of the P-type amorphous silicon layer and the N-type amorphous silicon layer may involve depositing amorphous silicon by PECVD at a deposition rate approximately in the range of 20-400 nanometers per minute. Annealing may be performed by heating at a temperature of approximately 700 degrees Celsius for a duration of approximately 10 minutes.

In one embodiment, a method of fabricating alternating N-type and P-type emitter regions of a solar cell involves forming a microcrystalline silicon layer on the amorphous dielectric layer by plasma enhanced chemical vapor deposition (PECVD). The method also involves forming an amorphous silicon layer on the microcrystalline silicon layer by PECVD, and doping first regions of the amorphous silicon layer with P-type dopants, and doping second regions of the amorphous polycrystalline silicon layer with N-type dopants. The first and second regions may be doped before or after annealing. Doping may involve implant, solid state doping, etc. In one embodiment involving implantation of dopants, the PECVD chamber and an implant chamber could be on a common tool. In one embodiment, the implantation and forming of the amorphous silicon layer by PECVD may be performed in the same chamber.

The method further involves annealing the microcrystalline silicon layer and the amorphous silicon layer to form a homogeneous polycrystalline silicon layer from the microcrystalline silicon layer and the amorphous silicon layer. The homogeneous polycrystalline silicon layer has first regions doped with P-type dopants and second regions doped with N-type dopants. The method also involves forming conductive contacts to the first regions of the homogeneous polycrystalline silicon regions and to the second regions of the homogeneous polycrystalline silicon layer.

In one such embodiment, forming the microcrystalline silicon layer by PECVD and the amorphous silicon layer by PECVD involves forming the microcrystalline silicon layer and the amorphous silicon layer in a single pass of a PECVD chamber. Forming the microcrystalline silicon layer may involve depositing microcrystalline silicon by PECVD at a deposition rate approximately in the range of 5-50 nanometers per minute. Forming the amorphous silicon layer may involve depositing amorphous silicon by PECVD at a deposition rate approximately in the range of 20-400 nanometers per minute.

In one embodiment, annealing the microcrystalline silicon layer and the amorphous silicon layer involves heating at a temperature of approximately 700 degrees Celsius for a duration of approximately 10 minutes. Forming the microcrystalline silicon layer may involve forming the microcrystalline silicon layer to a thickness approximately in the range of 2-50 nanometers, and forming the amorphous silicon layer may involve forming the amorphous silicon layer to a thickness approximately in the range of 10-300 nanometers. Annealing the microcrystalline silicon layer and the amorphous silicon layer to form the homogeneous polycrystalline silicon layer may include forming a blister-free homogeneous polycrystalline silicon layer.

Thus, the above-described processes may involve forming a thin tunnel oxide layer by radical oxidation and/or plasma oxidation of a silicon substrate in a vacuum chamber, e.g., a PECVD chamber, followed by PECVD blister-free a-Si deposition. The processes may be used in the fabrication of solar cells.

In one embodiment, active emitter structures may be formed directly using shadow masks. Current formation of high efficiency, interdigitated back contact solar cells involve seven process operations, including deposition of emitter materials, forming doping masks, and multiple operations of doping and etching. These processes can make up a significant portion of cell production cost. Embodiments include new manufacturing technologies to reduce emitter formation operations and cost. Embodiments include methods to deposit patterned, doped, active emitter structures directly in vacuum deposition tools.

According to one embodiment, a method involves depositing a first type (P-type or N-type) doped polycrystalline or amorphous silicon patterned fingers using a shadow mask. Then, the method involve depositing the second type (P-type or N-type) doped polycrystalline or amorphous silicon patterned fingers using a second shadow mask.

Figure 7:
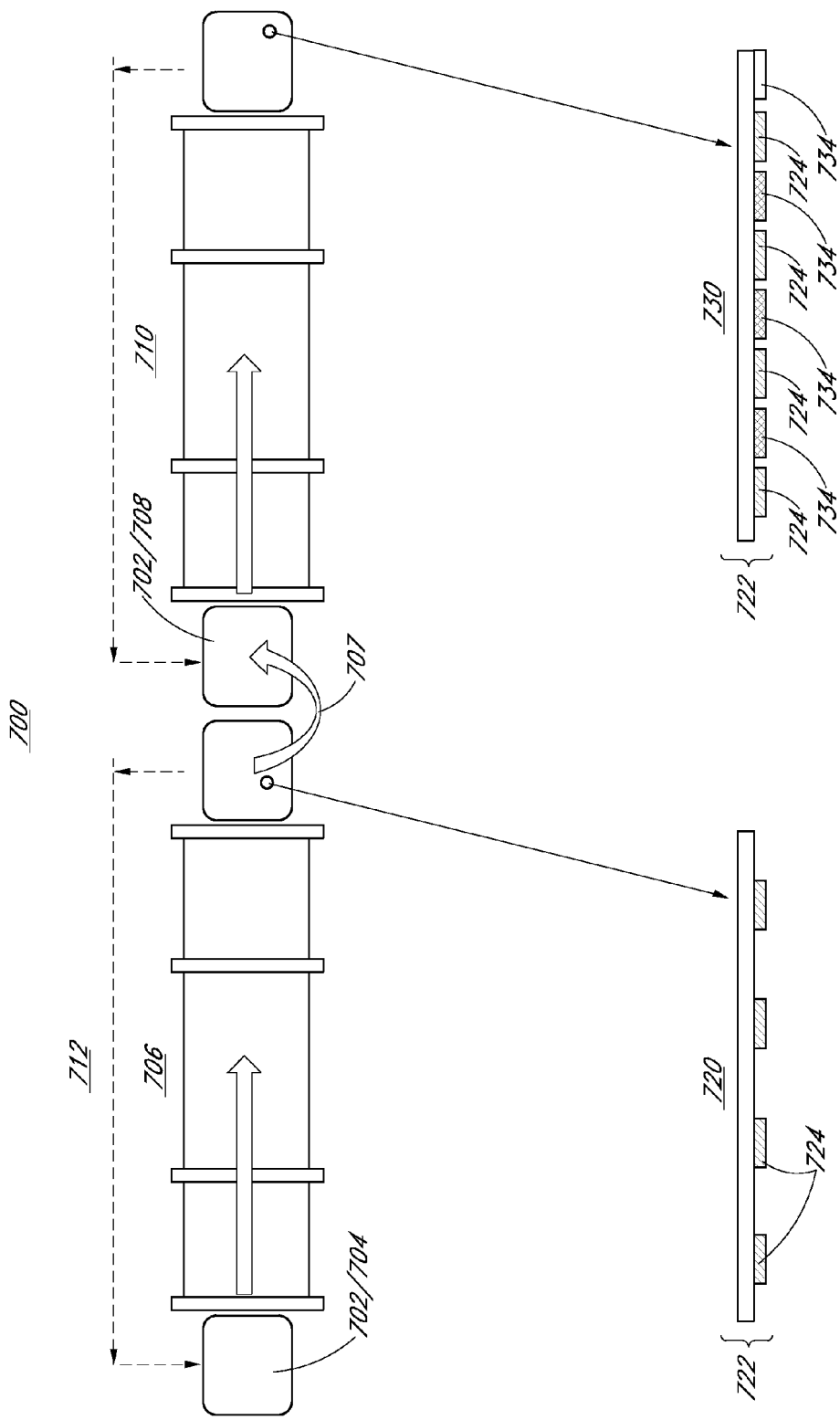
FIG. 7 illustrates a schematic diagram of a tool shadow masking tool, in accordance with an embodiment of the present disclosure.

FIG. 7 illustrates an example of a deposition tool 700 using shadow masking, in accordance with an embodiment of the present disclosure. Referring to FIG. 7, a wafer 702 is loaded into a first shadow-mask tray 704. The wafer/shadow mask tray 702/704 is introduced to a first section 706 of the tool 700 to deposit emitters of a first type (e.g., P-type) as doped polycrystalline silicon fingers. In one embodiment, having the associated mask in direct contact with the wafer 702 during deposition can result in a sharper pattern. Subsequent to forming the P-type doped polycrystalline silicon fingers, the wafer 702 is loaded into a second shadow-mask tray 708 at operation 707. The wafer/second shadow mask tray 708 is then introduced to a second section 710 of the tool 700 to deposit emitters of the second type (e.g., N-type) as doped polycrystalline silicon fingers. Some embodiments using direct deposition of the patterned, doped, emitters include a thin dielectric layer (e.g., the layer 602 of FIG. 6A). However, in other embodiments, using direct deposition of the patterned, doped, emitters do not include such a thin dielectric layer. The latter embodiments involve directly depositing emitter patterns on the wafers, which can eliminate separate, multi-operation deposition, pattern masking, and doping processes traditionally used to form high efficiency, interdigitated back contact emitters.

Referring again to FIG. 7, at operation 712, the first shadow mask tray 704 is transferred back to the loading station of the portion 706 of the tool 700. At operation 712, the second shadow mask tray 708 is transferred back to the loading station of the portion 710 of the tool 700. Apparatus 720 is an enlarged cross-sectional view of a solar cell 722 following first emitter regions 724 in the first portion 706 of the tool 700. Apparatus 730 is an enlarged cross-sectional view of a solar cell 722 following second emitter regions 734 in the second portion 710 of the tool 700.

In one embodiment, a shadow mask is used in solar cell metallization processes. Current metallization may require expensive metal patterning and plating processes. According to one embodiment, shadow-mask metallization involves depositing metal fingers directly on poly fingers through a shadow mask, which can form metal contacts. Shadow masking metallization can eliminate two metal patterning operations used in some existing methods. Shadow masking may also enable replacing plating operation with a lower-cost metallization process. FIGS. 8A-8H illustrate various operations in a method of shadow mask metallization, in accordance with an embodiment of the present disclosure.

Figure 8A:
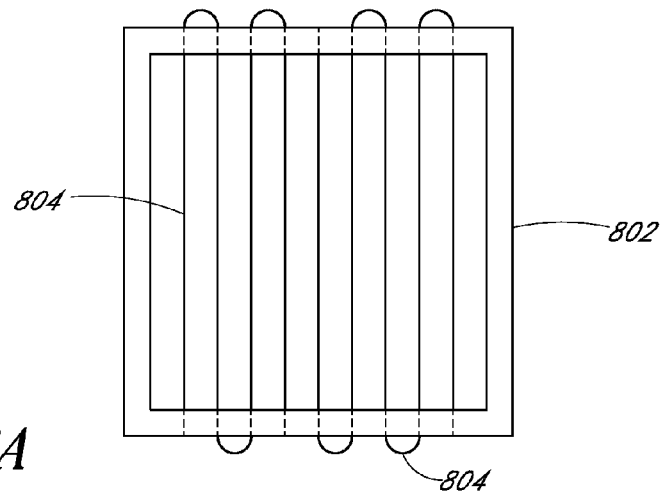
FIGS. 8A-8H illustrate various operations in a method of shadow mask metallization, in accordance with an embodiment of the present disclosure.
Figure 8B:
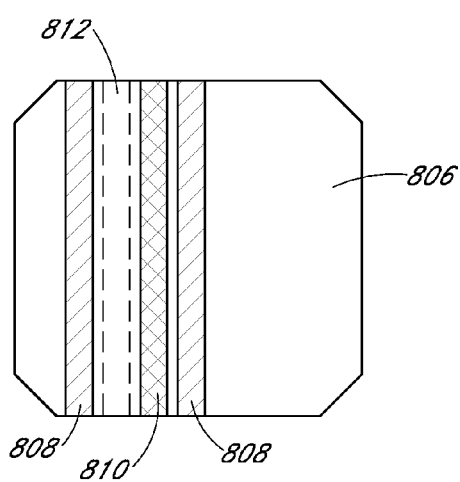

Referring to FIG. 8A, a wire mask 804 is included with a frame 802. In an embodiment, use of a wire mask 804 is scalable for pitch and need not require machining or etching. In one embodiment, the wire mask 804 is a stainless steel wire mask. Referring to FIG. 8B, the wire mask 804 can be used to form a solar cell 806 having linear emitter regions, such as alternating P-type 808 and N-type 810 lines, several of which are depicted in FIG. 8B. Such a layout provides straight P/N junction lines 812, and may not involve the formation of pads.

Figure 8C:
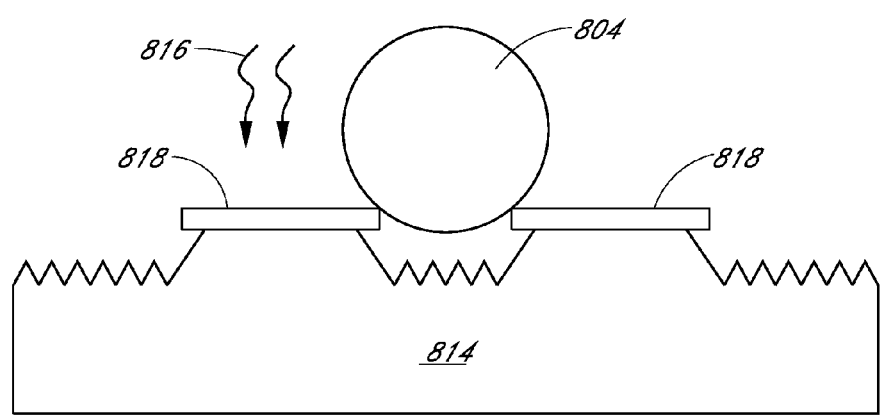

Referring to FIG. 8C, a cross-sectional view of a solar cell substrate 814, such as a silicon substrate, shows use of the wire mask 804 and associated sputtering or ebeam deposition 816 of polycrystalline silicon regions 818. Associated formation of aluminum or other seed metal regions 820 on the polycrystalline silicon regions 818 is depicted in FIG. 8D.

Figure 8D:
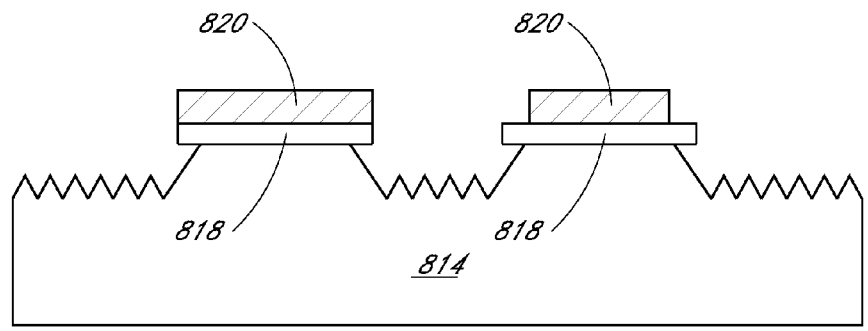
Figure 8E:
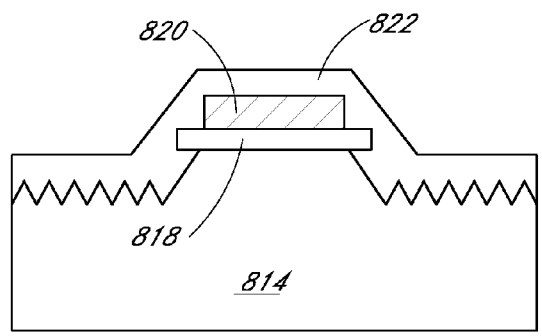

Referring to FIG. 8E, a blanket bottom anti-reflective coating (bARC) layer 822 is formed on the structure of FIG. 8D. Staggered contact openings 824 are formed through the bARC layer 822 (e.g., by laser ablation) to expose portions of the seed metal regions 820, as shown in the plan view of FIG. 8F. Further processing may include placement of solder balls on or in the contact openings 824. Alternatively, solder paste may be printed.

Figure 8F:
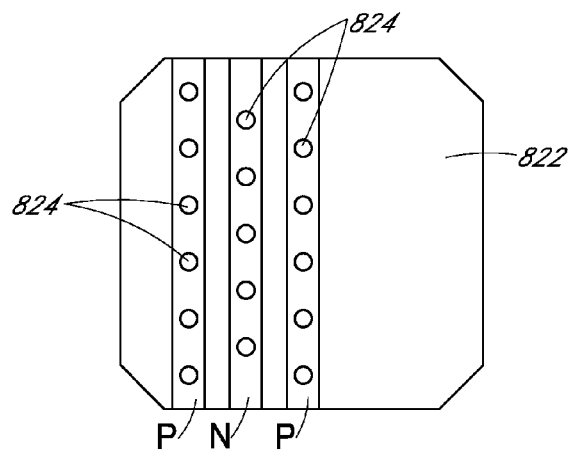
Figure 8G:
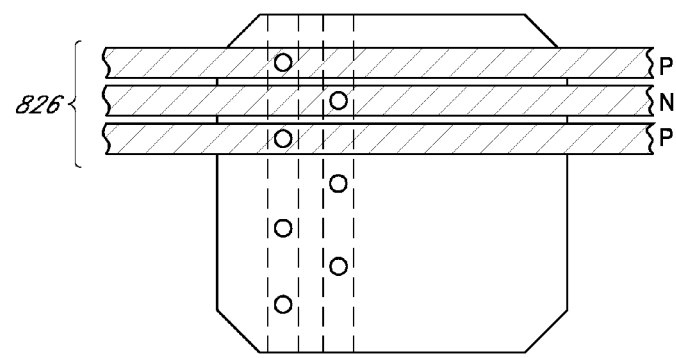
Figure 8H:
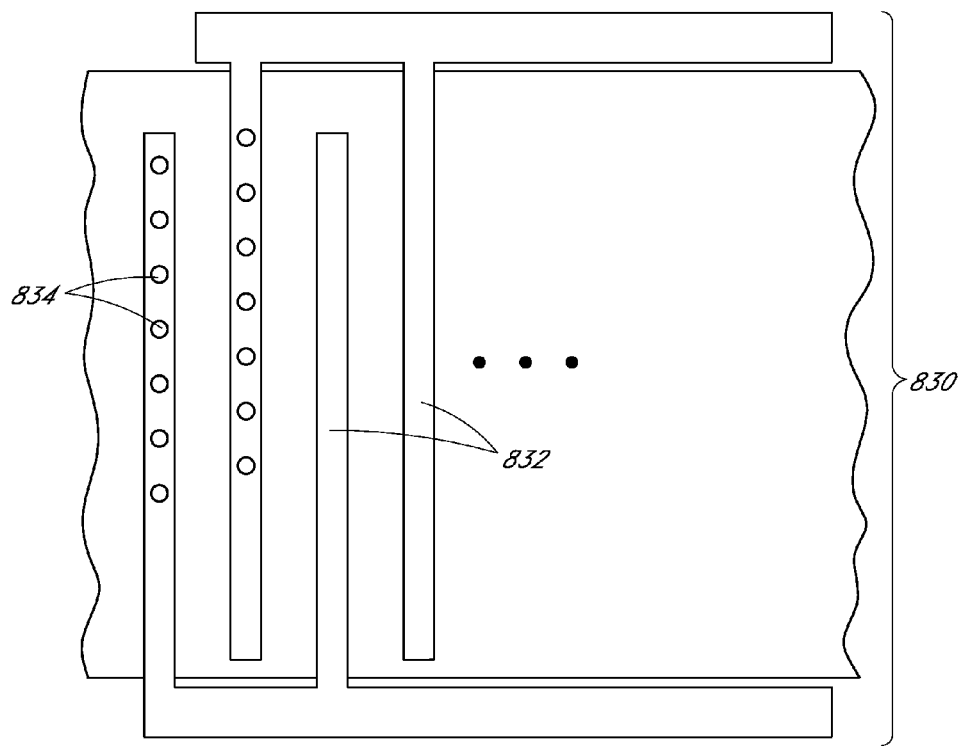

Referring to FIG. 8G, alternating wires or a pre-metallized backsheet including corresponding contact lines (both scenarios shown as contact lines 826) are electrically coupled to the solder balls or solder paste which in turn are coupled to the underlying alternating P-type 808 and N-type 810 lines. In the case that a pre-metallized backsheet is used, in an embodiment, the sheet is placed and then heat treated at a soldering temperature, e.g., approximately in the range of 180-250 degrees Celsius.

It is to be appreciated that variations of the process described in association with FIGS. 8F and 8G, in particular, may be implemented. For example, referring to FIG. 8H, in an embodiment, a pre-metallization backsheet 830 includes lines 832 having soldering balls or paste 834 thereon. In one such embodiment, the use of a bARC layer may be omitted and the backsheet may be coupled directly to the exposed underlying alternating P-type 808 and N-type 810 lines. In an embodiment, the backsheet is a copper or aluminum backsheet. In the case that a bARC layer (and associated damaging laser ablation) is omitted, the thickness of the alternating P-type 808 and N-type 810 polycrystalline silicon lines may be reduced (e.g., from approximately 3000 Angstroms to approximately 500 Angstroms) since tolerance for laser ablation is no longer needed. A reduction in polycrystalline silicon thickness for emitter region fabrication can decrease costs associated with the shadow mask deposition of the polycrystalline silicon and/or can improve conductivity of the resulting contact regions.

According to embodiments, prior to formation of the dielectric layers (e.g., the thin dielectric layers 522, 504, and 518), and/or deposition of a polycrystalline or amorphous silicon layer (e.g., the second silicon layer 520 of FIG. 5D), in some embodiments, the surface of the wafer is cleaned by a dry-cleaning process (e.g., by plasma cleaning).

Typical solar cell processing starts with a Si wafer. The wafer is then processed to etch back Si (e.g., in the 20-40 um range) to remove damage and contaminants from the Si surface to leave a pristine and clean wafer surface. Such a multi-operation process to etch Si in a caustic wet process, and then proceed with organic and metal wet cleans, can be costly and time consuming. Plasma cleans may improve and reduce the processing of the starting material prior to fabrication. According to embodiments, such processing can be achieved in a PECVD tool prior to emitter formation.

According to one embodiment, a pre-cleaning process may simplify and reduce the cost of silicon preparation and processing by integrating the surface preparation and cleaning using in-situ plasma processing. Such a pre-cleaning process can be combined with a plasma deposition process to reduce operation count and costs, as well as prepare the surface in a vacuum environment prior to the deposition processes. A multi-operation process can be designed to perform metal clean using Cl and Br based plasmas followed by organic cleans using O and N based plasmas. Surface preparation can be performed using F based plasmas to remove native oxides and/or defective Si. Such surface preparation can be immediately followed by deposition processing within the PECVD chamber.

Thus, cleaning the surface of the wafer prior to deposition in the PECVD chamber may involve multiple, different plasma cleaning operations. The different plasma cleaning operations may be used to remove different contaminations or residues. For example, a Cl and Br based plasmas may be used to remove metal contamination such as aluminum, aluminum oxide, iron, iron oxide, and/or other metal contaminants. A typical F based plasma cannot remove these metals because $AlF_3$ and $IrF_3$ are not volatile. $FeCl_3$ and $FeBr_3$ as well as $AlCl_3$ are much more volatile and can be removed with exposure to direct RF plasmas created using $CCl_4$, $BCl_3$, HCl, $Br_2$, etc. in the presence of Ar or He. Such a cleaning process can be followed by exposure of $O_2/N_2$ plasma to remove any organic contamination or a $CF_4/O_2$ plasma to remove native oxide and organics. It is to be appreciated that such operations have the possibility of removing defective Si as well, but with the risk of pitting.

Thus, embodiments involving such pre-cleaning processes can allow the surface to be prepared and tailored in a vacuum environment prior to deposition for solar cell fabrication. There are a variety of flows for which the above-mentioned processes can be performed. For example, in one embodiment, a pre-etched silicon wafer is received, or reduced operation count wet etch process is performed. The wafer is introduced into the PECVD chamber. In the PEVCD chamber, a metal clean is performed using Cl and/or Br based plasmas. Next, an organic clean is performed. After cleaning, the tunnel oxide may be formed, followed by the amorphous silicon (either doped or undoped).

Overall, although certain materials are described specifically above, some materials may be readily substituted with others with other such embodiments remaining within the spirit and scope of embodiments of the present disclosure. For example, in an embodiment, a different material substrate, such as a group III-V material substrate, can be used instead of a silicon substrate. Furthermore, it is to be understood that, where N+ and P+ type doping is described specifically, other embodiments contemplated include the opposite conductivity type, e.g., P+ and N+ type doping, respectively. Furthermore, it is to be appreciated that a silicidation approach that can be used in place of an aluminum seed layer for contact formation may also be applicable to front contact solar cells.

Furthermore, in an embodiment, a cluster plasma enhanced chemical vapor deposition (PECVD) tool can be used to combine many of the above described process operations in a single pass in a process tool. For example, in one such embodiment, up to four distinct PECVD operations and a rapid thermal processing (RTP) operation can be performed in a single pass in a cluster tool. The PECVD operations can includes depositions of layers such as the above described back side P+ polysilicon layer, both front and back side N+ polysilicon layers, and the ARC layer.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
   forming a thin dielectric layer on a surface of a substrate by radical oxidation or plasma oxidation of the surface of the substrate;
   forming a first silicon layer over the thin dielectric layer;
   patterning the first silicon layer, the thin dielectric layer, and a portion of the substrate to form a first emitter region from the first silicon layer, the first emitter region adjacent a trench; and
   forming a second silicon layer in the trench and over a portion of the first emitter region to form a second emitter region adjacent the first emitter region.

2. The method of claim 1, further comprising:
   prior to forming the thin dielectric layer, dry cleaning the surface of the substrate to remove metal or organic contaminants.

3. The method of claim 2, wherein dry cleaning the surface of the substrate comprises dry cleaning in a plasma enhanced chemical vapor deposition (PECVD) chamber.

4. The method of claim 1, wherein forming the thin dielectric layer on the surface of the substrate comprises forming the thin dielectric layer in a plasma enhanced chemical vapor deposition (PECVD) chamber.

5. The method of claim 1, wherein forming the first silicon layer comprises forming the first silicon layer in a plasma enhanced chemical vapor deposition (PECVD) chamber.

6. The method of claim 5, wherein forming the thin dielectric layer on the surface of the substrate comprises forming the thin dielectric layer in the PECVD chamber.

7. The method of claim 6, further comprising:
   prior to forming the thin dielectric layer, dry cleaning the surface of the substrate to remove metal or organic contaminants, the dry cleaning performed in the PECVD chamber.

8. The method of claim 1, wherein forming the first emitter region from the first silicon layer comprises doping the first silicon layer in an implant chamber housed in a tool that also houses a plasma enhanced chemical vapor deposition (PECVD) chamber used to form the thin dielectric layer or the first silicon layer, or both.

9. The method of claim 1, further comprising:
forming conductive contacts electrically connected to the first and second emitter regions.

10. The method of claim 1, wherein forming the thin dielectric layer on the surface of the substrate comprises forming the thin dielectric layer by radical oxidation.

11. The method of claim 1, wherein forming the thin dielectric layer on the surface of the substrate comprises forming the thin dielectric layer by plasma oxidation.

12. A method of fabricating a solar cell, the method comprising:
forming a first thin dielectric layer on a surface of a substrate;
forming a first silicon layer over the first thin dielectric layer;
patterning the first silicon layer, the first thin dielectric layer, and a portion of the substrate to form a first emitter region from the first silicon layer, the first emitter region adjacent a trench;
forming a second thin dielectric layer on sidewalls of the patterned first silicon layer by radical oxidation or plasma oxidation of the surface of sidewalls of the patterned first silicon layer; and
forming a second silicon layer in the trench and over a portion of the first emitter region to form a second emitter region adjacent the first emitter region, wherein the second thin dielectric layer laterally electrically isolates the first emitter region from the second emitter region.

13. The method of claim 12, wherein forming the second thin dielectric layer on sidewalls of the patterned first silicon layer comprises forming the second thin dielectric layer in a plasma enhanced chemical vapor deposition (PECVD) chamber.

14. The method of claim 1, wherein forming the second silicon layer comprises forming the second silicon layer in a plasma enhanced chemical vapor deposition (PECVD) chamber.

15. The method of claim 14, wherein forming the second thin dielectric layer on sidewalls of the patterned first silicon layer comprises forming the thin dielectric layer in the PECVD chamber.

16. The method of claim 12, wherein forming the second emitter region from the second silicon layer comprises doping the second silicon layer in an implant chamber housed in a tool that also houses a plasma enhanced chemical vapor deposition (PECVD) chamber used to form the second thin dielectric layer or the second silicon layer, or both.

17. The method of claim 12, further comprising:
forming conductive contacts electrically connected to the first and second emitter regions.

18. The method of claim 12, wherein forming the second thin dielectric layer on sidewalls of the patterned first silicon layer comprises forming the second thin dielectric layer by radical oxidation.

19. The method of claim 12, wherein forming the second thin dielectric layer on sidewalls of the patterned first silicon layer comprises forming the second thin dielectric layer by plasma oxidation.

* * * * *